US008797432B2

(12) United States Patent
Cho

(10) Patent No.: US 8,797,432 B2
(45) Date of Patent: Aug. 5, 2014

(54) IMAGING SYSTEM WITH AN ARRAY OF IMAGE SENSORS

(75) Inventor: Kwang-Bo Cho, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 413 days.

(21) Appl. No.: 13/071,342

(22) Filed: Mar. 24, 2011

(65) Prior Publication Data

US 2012/0188422 A1   Jul. 26, 2012

Related U.S. Application Data

(60) Provisional application No. 61/434,781, filed on Jan. 20, 2011.

(51) Int. Cl.
*H04N 5/335* (2011.01)
*H04N 5/369* (2011.01)
*H04N 5/374* (2011.01)
*H01L 27/146* (2006.01)
*H04N 5/376* (2011.01)
*H04N 5/225* (2006.01)

(52) U.S. Cl.
CPC ........... *H04N 5/2258* (2013.01); *H04N 5/3698* (2013.01); *H04N 5/3696* (2013.01); *H04N 5/3741* (2013.01); *H01L 27/14634* (2013.01); *H04N 5/376* (2013.01); *H01L 27/14601* (2013.01); *H01L 27/14643* (2013.01)
USPC .......................................... 348/280; 348/294

(58) Field of Classification Search
CPC ................... H01L 27/14601; H01L 27/14634; H01L 27/14643; H04N 5/2258; H04N 5/3696; H04N 5/3698; H04N 5/378
USPC .................................................. 348/280, 294
See application file for complete search history.

(56) References Cited

U.S. PATENT DOCUMENTS

| | | | |
|---|---|---|---|
| 5,361,127 A | 11/1994 | Daily | |
| 7,019,302 B2* | 3/2006 | Takabayashi et al. | ... 250/370.11 |
| 7,061,532 B2* | 6/2006 | Silverstein | .................... 348/335 |
| 7,620,309 B2 | 11/2009 | Georgiev | |
| 7,732,744 B2* | 6/2010 | Utagawa | ..................... 250/208.1 |
| 7,737,390 B2* | 6/2010 | Sarig et al. | ................. 250/208.1 |
| 2009/0140131 A1* | 6/2009 | Utagawa | ....................... 250/226 |
| 2010/0110254 A1* | 5/2010 | Mo et al. | ....................... 348/308 |
| 2012/0013780 A1* | 1/2012 | Mo et al. | ....................... 348/308 |
| 2012/0050562 A1* | 3/2012 | Perwass et al. | ............ 348/222.1 |

* cited by examiner

*Primary Examiner* — Aung S Moe
*Assistant Examiner* — Amy Hsu
(74) *Attorney, Agent, or Firm* — Treyz Law Group; David C. Kellogg

(57) ABSTRACT

An integrated circuit may have rows and columns of imaging pixel arrays. Row driver circuitry and column readout circuitry may be shared between the imaging pixel arrays. Control circuit blocks may bypass inactive pixel arrays and may shift signals between different signal paths on the integrated circuit. The control circuit blocks may include synchronizing circuitry for deskewing control signals and buffer circuitry for regenerating weak signals as they are distributed across the integrated circuit. An array of lenses may be associated with the integrated circuit. The spacing between imaging pixel arrays may differ at different parts of the integrated circuit. Images from multiple image sensor pixel arrays may be combined to form a single digital image. Image sensors may be provided with unique lenses, different color responses, different image pixels, different image pixel patterns, and other differences. Reference pixels may be interposed in the gaps between image sensor arrays.

7 Claims, 15 Drawing Sheets

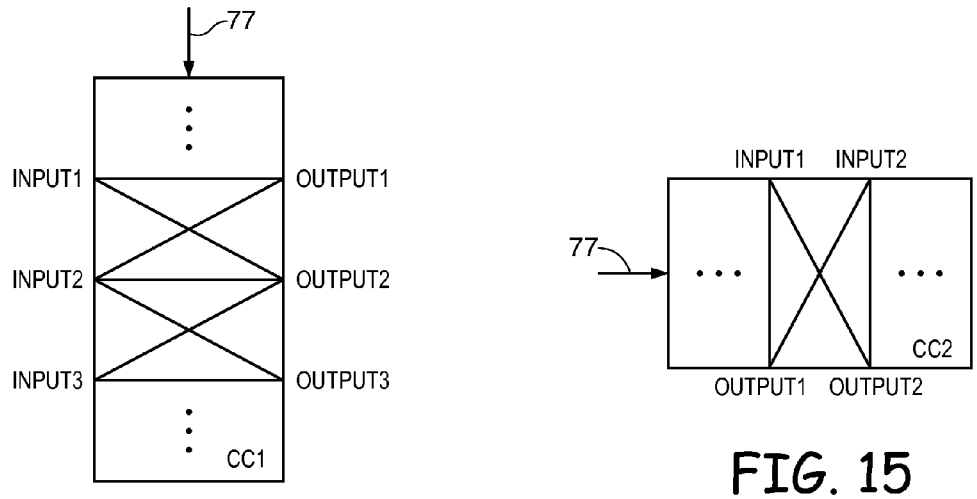
FIG. 14
FIG. 15
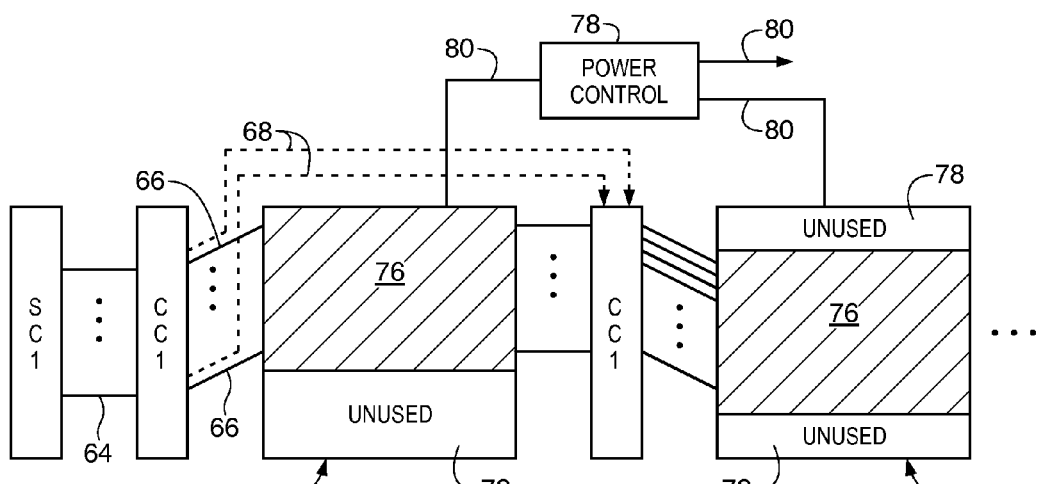
FIG. 16

IMAGING SYSTEM WITH AN ARRAY OF IMAGE SENSORS

This application claims the benefit of provisional patent application No. 61/434,781, filed Jan. 20, 2011, which is hereby incorporated by reference herein in its entirety.

BACKGROUND

The present invention relates to image sensors and, more particularly, to imaging devices with arrays of image sensors.

Image sensors are commonly used in electronic devices such as cellular telephones, cameras, and computers to capture images. In a typical arrangement, an electronic device is provided with a single image sensor and a single corresponding lens. Some electronic devices use arrays of image sensors and corresponding lenses to gather image data. This type of system may be used to minimize camera thickness, extend depth of focus, increase output resolution through super-resolution processing, and otherwise improve sensor performance. Efficient use of multiple sensors poses challenges. For example, care must be taken when controlling the sensors and laying out the circuitry on an image sensor die.

It would be desirable to be able to provide improved imaging systems based on image sensor arrays and improved control circuitry for image sensor arrays.

BRIEF DESCRIPTION OF THE DRAWINGS

FIG. 14 is a diagram of an illustrative block of control circuitry of the type that may be used in controlling the control signals that are distributed on horizontal control lines in a sensor array in accordance with an embodiment of the present invention.

FIG. 15 is a diagram of an illustrative block of control circuitry of the type that may be used in controlling vertically distributed lines in accordance with an embodiment of the present invention.

FIG. 16 is a diagram showing how image sensor control signals may be shifted using control circuitry that selects which signal lines are used in a sensor array and showing how unused image sensor pixel arrays may be bypassed and powered down in accordance with an embodiment of the present invention.

DETAILED DESCRIPTION

Digital camera modules are widely used in electronic devices such as digital cameras, computers, cellular telephones, and other electronic devices. These electronic devices may include image sensors that gather incoming light to capture an image. The image sensors may include arrays of image pixels. The pixels in the image sensors may include photosensitive elements such as photodiodes that convert the incoming light into digital data. Image sensors may have any number of pixels (e.g., hundreds or thousands or more). A typical image sensor may, for example, have hundreds, thousands, or millions of pixels (e.g., megapixels).

Figure 1:
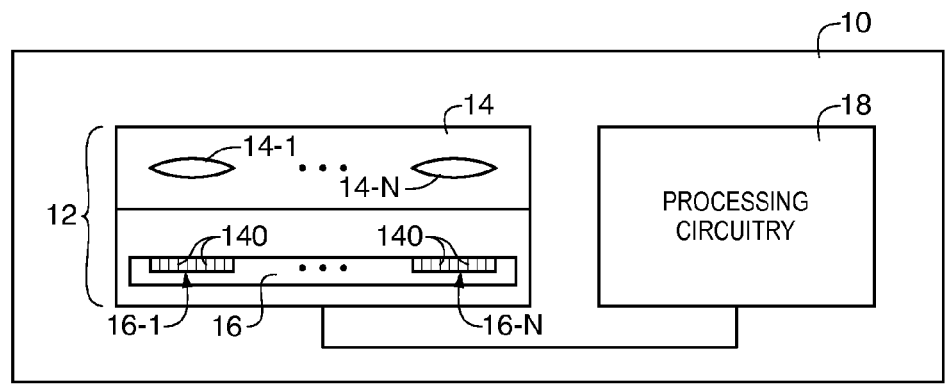
FIG. 1 is a diagram of an illustrative electronic device that contains a camera module with an array of lenses and an array of corresponding image sensors in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include an array of lenses 14 and a corresponding array of image sensors 16. During image capture operations, light from a scene may be focused onto image sensors 16-1, . . . 16-N using respective lenses 14-1, . . . 14-N. Lenses 14 and image sensors 16 may be mounted in a common package and may provide image data to processing circuitry 18.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

There may be any suitable number of lenses 14 in lens array 14 and any suitable number of image sensors in image sensor array 16. Lenses 14 may be identical or may be different (e.g., some of lenses 14 may have different focal lengths, some may be convex, some may be concave, etc.). Lens array 14 may, as an example, include N*M individual lenses arranged in an N×M two-dimensional array. The values of N and M may be equal to or greater than one, may be equal or greater than two, may be equal to or greater than three, may exceed 10, or may have any other suitable values. Image sensor array 16 may contain a corresponding N×M two-dimensional array of individual image sensors. The image sensors may be formed on one or more separate semiconductor substrates. With one suitable arrangement, which is sometimes described herein as an example, the image sensors are formed on a common semiconductor substrate (e.g., a common silicon image sensor integrated circuit die). Each image sensor may be identical or there may be different types of image sensors in a given image sensor array integrated circuit. Each image sensor may be a Video Graphics Array (VGA) sensor with a resolution of 480×640 sensor pixels (as an example). Other types of sensor pixels may also be used for the image sensors if desired. For example, images sensors with greater than VGA resolution sensor (e.g., high-definition image sensors) or less than VGA resolution may be used, image sensor arrays in which the image sensors are not all identical may be used, etc.

The use of a camera module with an array of lenses and an array of corresponding image sensors (i.e., an array camera) may allow images to be captured with increased depth of field because each image sensor in the array may be smaller than a conventional image sensor. The reduced image sensor size allows the focal length of each lens in the lens array to be reduced relative to that of a conventional single-lens configuration. Color cross-talk may also be reduced, because a single color filter can be used for each sub-array instead of using a conventional Bayer pattern or other multiple-color color filter array pattern. With a single color filter arrangement of this type, there is no opportunity for color information to bleed from one channel to another. As a result, signal-to-noise ratio and color fidelity may be improved. The color filters that are used for the image sensor pixel arrays in the image sensors may, for example, be red filters, blue filters, and green filters. Each filter may form a color filter layer that covers the image sensor pixel array of a respective image sensor in the array. Other filters such as infrared-blocking filters, filters that block visible light while passing infrared light, ultraviolet-light blocking filters, white color filters, etc. may also be used. In an array with numerous image sensors, some of the image sensors may have red filters, some may have blue color filters, some may have green color filers, some may have patterned color filters (e.g., Bayer pattern filters, etc.), some may have infrared-blocking filters, some may have ultraviolet light blocking filters, some may be visible-light-blocking-and-infrared-passing filters, etc. The image sensor image sensor integrated circuit may have combinations of two or more, three or more, or four or more of these filters or may have filters of only one type. Processing circuitry 18 (e.g., processing circuitry integrated onto sensor array integrated circuit 16 and/or processing circuitry on one or more associated integrated circuits) can select which digital image data to use in constructing a final image for the user of device 10. For example, circuitry 18 may be used to blend image data from red, blue, and green sensors to produce full-color images, may be used to select an infrared-passing filter sensor when it is desired to produce infrared images, may be used to produce 3-dimensional images using data from two or more different sensors that have different vantage points when capturing a scene, etc. In some modes of operation, all of the sensors on array 16 may be active (e.g., when capturing high-quality images). In other modes of operation (e.g., a low-power preview mode), only a subset of the image sensors may be used. Other sensors may be inactivated to conserve power (e.g., their positive power supply voltage terminals may be taken to a ground voltage or other suitable power-down voltage and their control circuits may be inactivated or bypassed).

Figure 2:
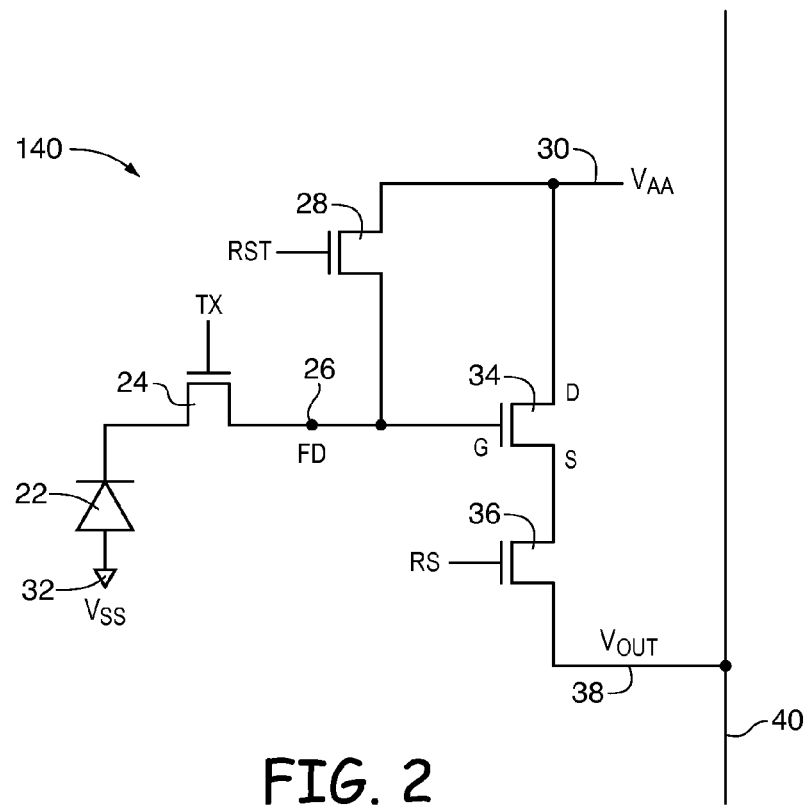
FIG. 2 is a diagram of an illustrative image sensor pixel in accordance with an embodiment of the present invention.

Circuitry in an illustrative pixel of one of the image sensors in sensor array 16 is shown in FIG. 2. As shown in FIG. 2, pixel 140 includes a photosensitive element such as photodiode 22. A positive power supply voltage (e.g., voltage Vaa) may be supplied at positive power supply terminal 30. A ground power supply voltage (e.g., Vss) may be supplied at ground terminal 32. Incoming light is collected by photodiode 22 after passing through a color filter structure. Photodiode 22 converts the light to electrical charge.

Before an image is acquired, reset control signal RST may be asserted. This turns on reset transistor 28 and resets charge storage node 26 (also referred to as floating diffusion FD) to Vaa. The reset control signal RST may then be deasserted to turn off reset transistor 28. After the reset process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26. Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiode 22. The signal associated with the stored charge on node 26 is conveyed to row select transistor 36 by source-follower transistor 34. When it is desired to read out the value of the stored charge (i.e., the value of the stored charge that is represented by the signal at the source S of transistor 34), row select control signal RS can be asserted. When signal RS is asserted, transistor 36 turns on and a corresponding signal Vout that is representative of the magnitude of the charge on charge storage node 26 is produced on output path 38. In a typical configuration, there are numerous rows and columns of pixels such as pixel 140 in the image sensor pixel array of a given image sensor. A vertical conductive path such as path 40 can be associated with each column of pixels. When signal RS is asserted in a given row, path 40 can be used to route signal Vout from that row to readout circuitry. If desired, other types of image pixel circuitry may be used to implement the image pixels of sensors 16-1, . . . 16-N. For example, each image sensor pixel 140 (see, e.g., FIG. 1) may be a three-transistor pixel, a pinphotodiode pixel with four transistors, a global shutter pixel, a time-of-flight pixel, etc. The circuitry of FIG. 2 is merely illustrative.

Figure 3:
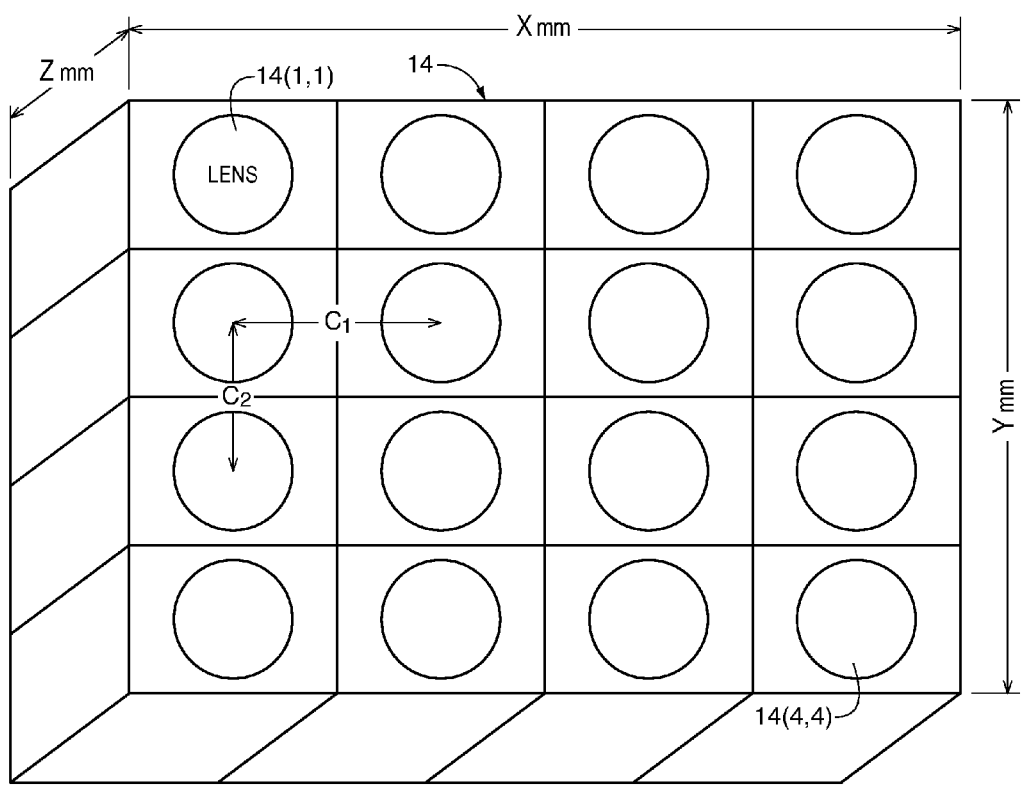
FIG. 3 is a perspective view of an illustrative camera module having an array of lenses in accordance with an embodiment of the present invention.

FIG. 3 is a perspective view of an illustrative camera module having an array 14 of lenses (e.g., lenses such as lenses 14(1,1), and 14(4,4)). The array of lenses may, for example, be a rectangular array having rows and columns of lenses. The lenses may all be equally spaced from one another or may have different spacings. For example, the lens array may have a horizontal center-to-center spacing C1 that is the same as or different than vertical center-to-center spacing C2. There may be any suitable number of lenses 14 in the array. In the FIG. 3 example, there are four rows and four columns of lenses.

Figure 4:
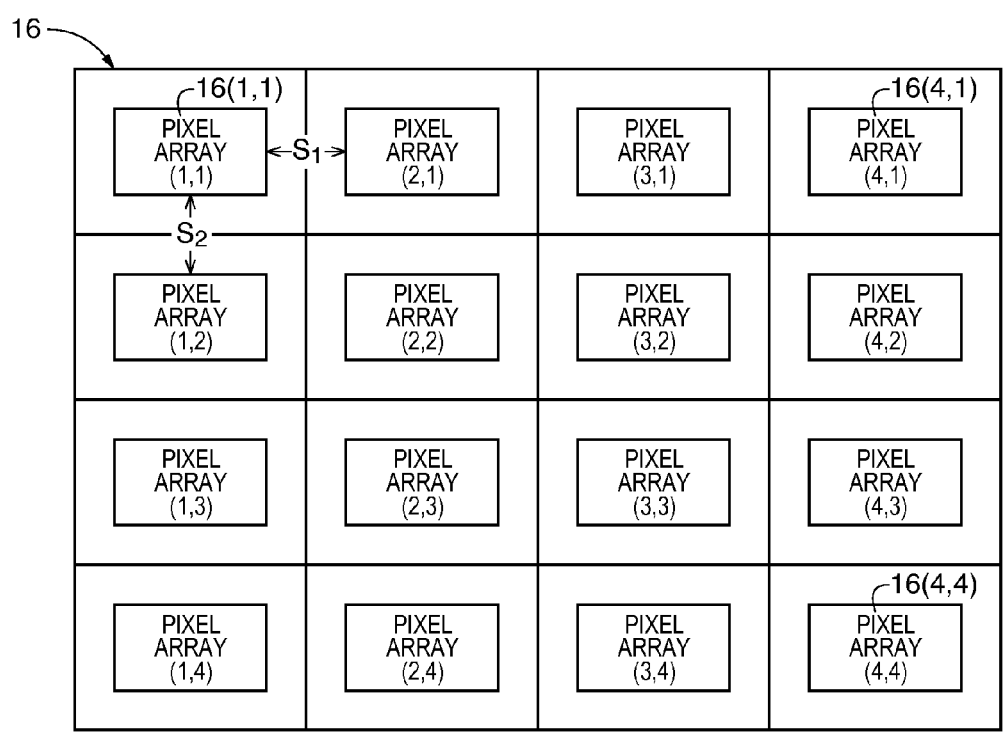
FIG. 4 is a diagram of an illustrative sensor array of the type that may be used with the lens array of FIG. 3 in a camera module in accordance with an embodiment of the present invention.

An illustrative sensor array of the type that may be used with the lens array of FIG. 3 is shown in FIG. 4. As shown in FIG. 4, sensor array 16 may include image sensors such as sensor 16(1,1), 16(4,1), and 16(4,4). The image sensors in array 16 may be separated horizontally by spacing S1 and vertically by spacing S2 (sometimes referred to as gaps G). The values of S1 and S2 may be the same or may be different (and may be, for example about 200-300 microns or other suitable size when using discrete optics to implement the lens array or less than 300 microns when using wafer level optics to implement the lens array). The array of FIG. 4 has sixteen image sensors, but, in general, array 16 may have any suitable number of image sensors (e.g., two or more sensors, four or more sensors, ten or more sensors, 20 or more sensors, etc.).

Figure 5:
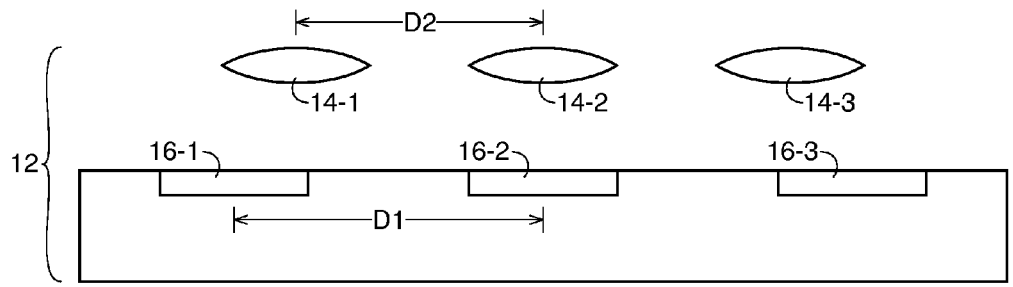
FIG. 5 is a cross-sectional side view of an illustrative camera module showing how the center-to-center spacing of respective image sensors may be varied as a function of position on an image sensor array integrated circuit in accordance with an embodiment of the present invention.

As shown in FIG. 5, camera module 12 may have lenses that are evenly spaced and sensors whose spacing varies as a function of location on image sensor array 16 (e.g., a unitary image sensor array integrated circuit die that contains multiple image sensors). In particular, lenses 14-1 and 14-2 may be separated by a center-to-center spacing of D2 and lenses 14-2 and 14-3 may likewise be separate by distance D2. To help ensure that the images acquired by each of the image sensors overlaps, it may be desirable to increase the center-to-center spacing of the image sensors in image sensor array 16 as a function of their distance from the center of image sensor array 16. For example, it may be desirable to locate sensor 16-1 so that sensor 16-1 does not lie directly below lens 14-1. In particular, sensors 16-1 and 16-2 may have a center-to-center spacing D1 that is greater than lens-to-lens spacing D2 for lenses 14-1 and 14-2.

Figure 6:
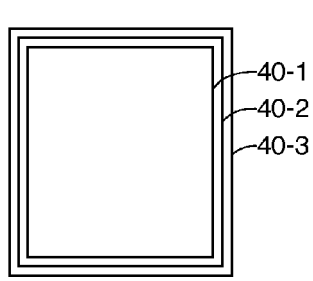
FIG. 6 is a diagram showing how images acquired using a camera module of the type shown in FIG. 5 may fully overlap in accordance with an embodiment of the present invention.
Figure 7:
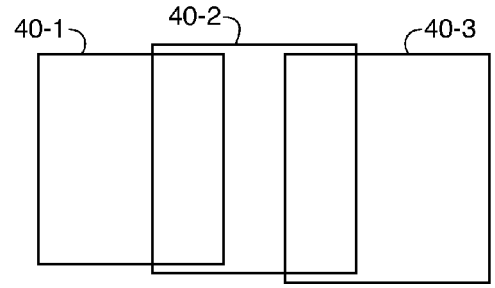
FIG. 7 is a diagram showing how acquired images may overlap only partly when using a camera module with equally spaced lenses and image sensors in accordance with an embodiment of the present invention.

As a result of separating image sensors that are located near the periphery of image sensor chip 16 from each other by distances that are greater than for the image sensors in the center of chip 16, the images 40-1, 40-2, and 40-3 that are captured, respectively, by image sensors 16-1, 16-2, and 16-3 may be caused to overlap completely (or at least substantially), as shown in FIG. 6. This allows all of the images from the individual sensors to be combined to improve image quality in the resulting combined image for device 10. If images sensors 16-1, 16-2, and 16-3 are separated by a spacing D1 that is equal to D2, images 40-1, 40-2, and 40-3 will tend to only partly overlap, as shown in FIG. 7. After gathering separate images (whether fully or partly overlapped), processing circuitry 18 (FIG. 1) may perform image processing operations to convert the separate images into a final merged image for the user of device 10.

Figure 8:
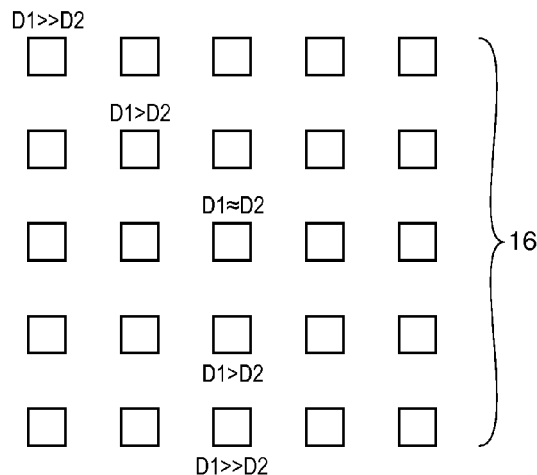
FIG. 8 is a diagram showing how image sensor center-to-center spacing may be varied as a function of position within an image sensor array integrated circuit in accordance with an embodiment of the present invention.

In the illustrative example of FIG. 5, camera module 12 has a one-dimensional lens array with three lenses and a one-dimensional image sensor array with three corresponding image sensors. If desired, camera module 12 may be formed using a two-dimensional array of lenses and a corresponding two-dimensional array of image sensors. The lens may, for example, each be horizontally and vertically spaced from each other using a uniform center-to-center spacing (i.e., the center-to-center spacing of the lenses may be set to a fixed value of D2). To ensure that the separate images gathered using the images sensors substantially overlap as shown in FIG. 6, the image sensors that lie on or near the periphery of the sensor array may be provided with larger center-to-center spacings D1 than the image sensors that lie at or near the center of the sensor array. As a result, D1 will be largest compared to D2 near the periphery of image sensor array 16 and will be nearest to D2 (or equal to D2) near the center of array 16, as shown in FIG. 8. The FIG. 8 example includes a 5×5 array of image sensors, but larger or smaller arrays may be used in device 10 if desired.

Figure 9:
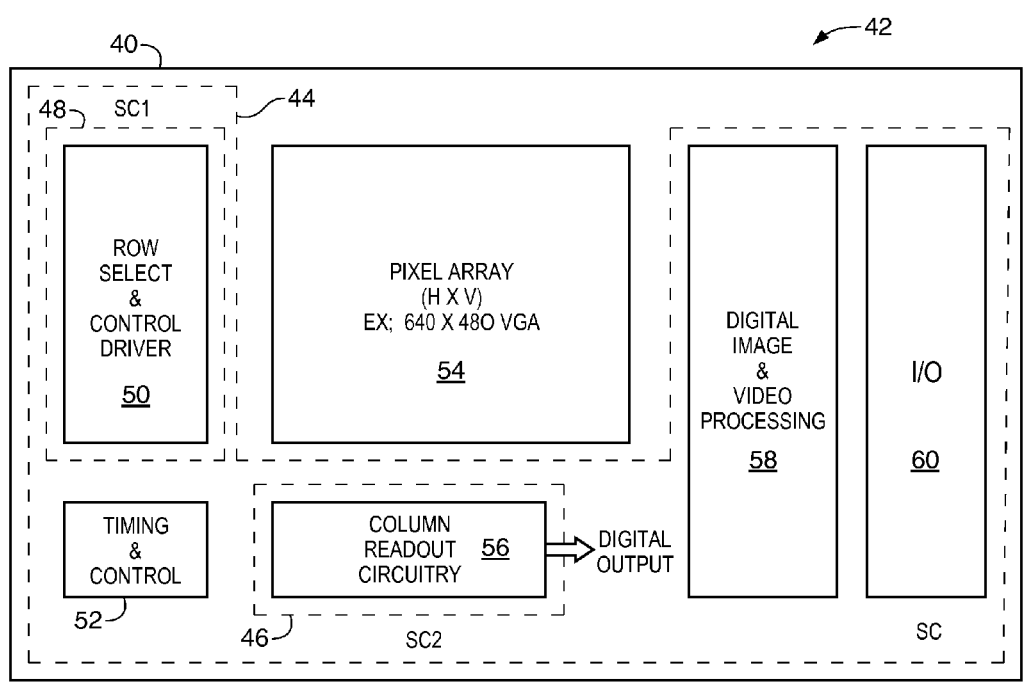
FIG. 9 is a diagram of a conventional integrated circuit containing an image sensor.

A conventional image sensor is shown in FIG. 9. In the arrangement of FIG. 9, image sensor 42 is the sole image sensor on image sensor integrated circuit die 40. Image sensor 42 includes an array of image pixels 54. Control circuitry 44 is used to issue control signals for the image sensor pixels in array 54 and is used to read out image data signals from the image sensor pixels in array 54. In a typical arrangement, control signals are supplied to pixel array 54 on horizontal lines (row lines) and image sensor data is read out of array 54 on vertical lines (column lines).

Control circuitry 44 (sometimes referred to as support circuitry SC) includes row-select and control driver circuitry 50 (sometimes referred to as support circuitry SC1) that issues control signals such as reset signals, row select signals, etc. for controlling rows of pixels in array 54. Column readout circuitry 56 (sometimes referred to as support circuitry SC2) receives analog image data signals from columns of image sensor pixels in array 54 using vertical data lines and sample-and-hold circuitry and, following digitization using analog-to-digital converter circuitry, provides corresponding digitized output signals to digital image and video processing circuitry 58 in circuitry 44. Timing and control circuitry 52 issues timing control signals (clocks) for use by circuitry 50 and 56. Circuitry 58 may process image data from circuitry 56 to produce images (e.g., by converting RGB data to YUV data, etc.). Input-output circuitry 60 may store the images in local storage and may be used to convey the images to external equipment.

Figure 10:
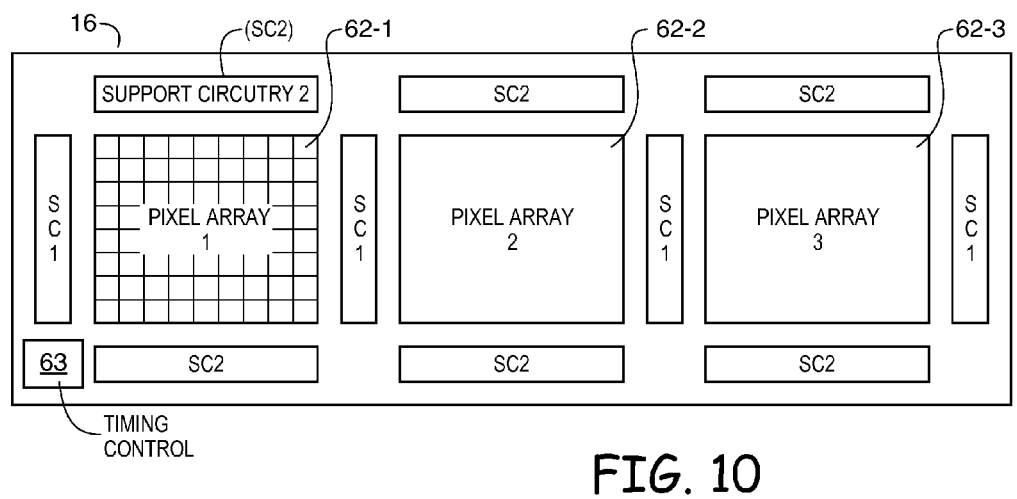
FIG. 10 is a diagram of an illustrative horizontal array of image sensors in accordance with an embodiment of the present invention.
Figure 11:
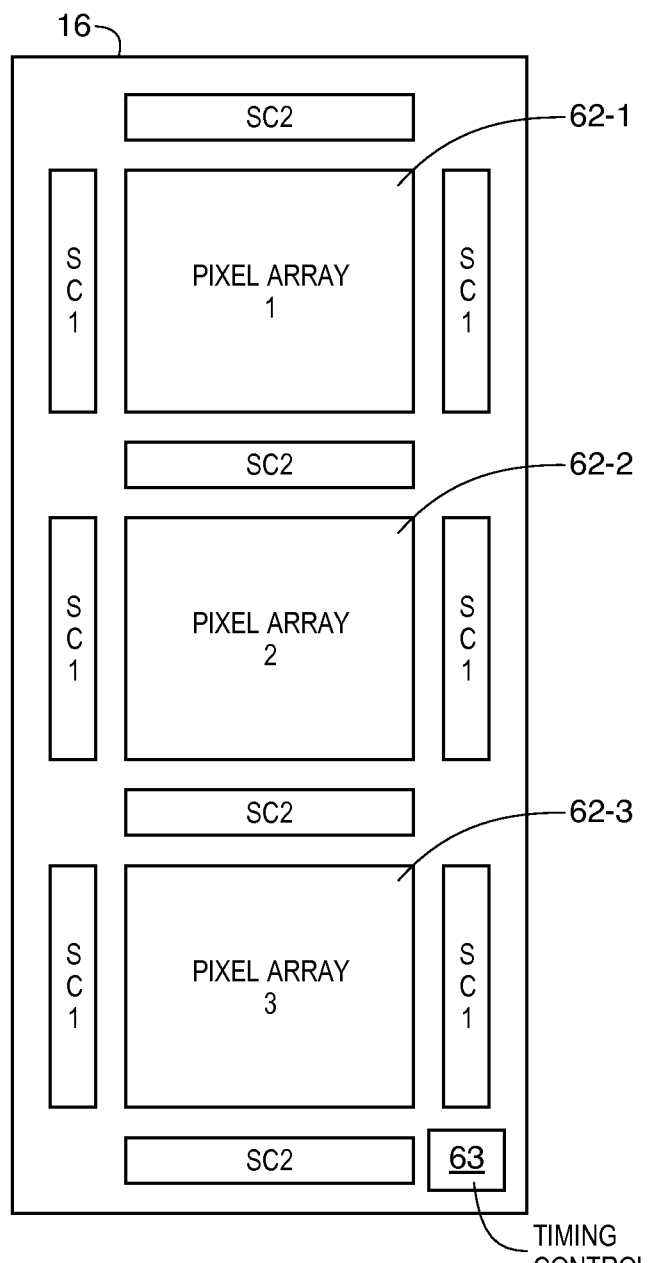
FIG. 11 is a diagram of an illustrative vertical array of image sensors in accordance with an embodiment of the present invention.

A diagram of an illustrative horizontal array of image sensors is shown in FIG. 10. FIG. 11 is a diagram of an illustrative vertical array of image sensors. The image sensor arrays 16 of FIGS. 10 and 11 may each be formed from a single integrated circuit die (as an example). As shown in the illustrative arrangements of FIGS. 10 and 11, image sensor array 16 may include (as an example) three image sensor pixel arrays 62-1, 62-2, and 62-3. Each pixel array may have rows and columns of image pixels such as image pixel 140 of FIG. 2 or other suitable image pixels. Image sensor pixel arrays 62-1, 62-2, and 62-3 may have any suitable resolution (e.g., 640×480, etc.). Timing control circuitry 63 may be shared by the control circuit blocks and image sensors on each die or multiple blocks of timing control circuitry 63 may be provided.

Support circuitry SC1 (e.g., row select and control driver circuitry such as circuitry 50 of FIG. 9) may be placed adjacent to each image sensor pixel array, so that each image sensor pixel is surrounded on at least two sides by associated support circuitry SC1. Support circuitry (control circuitry) SC1 may be used to issue reset signals, row select signals RS, etc. for the image sensor pixel arrays. Support circuitry (control circuitry) SC2 may likewise be located on two opposing sides of each image sensor pixel array (e.g., for reading out image sensor data along associated output lines such as output line 40 of FIG. 2).

Figure 12:
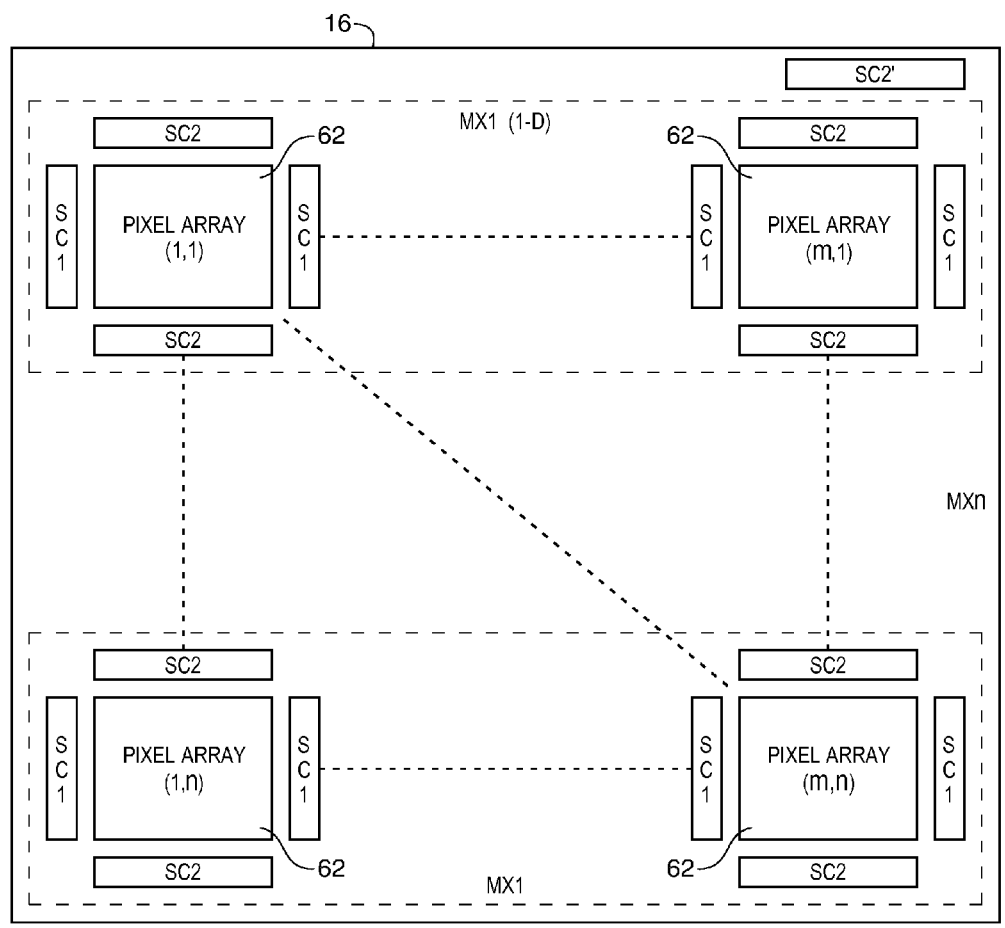
FIG. 12 is a diagram of an illustrative M×N array of image sensors in accordance with an embodiment of the present invention.

A diagram of an illustrative M×N array of image sensors is shown in FIG. 12. The values of M and N may range from 1 to 10 or may be greater than 10. As shown in FIG. 12, each pixel array 62 may be surrounded by associated support circuitry SC1 and support circuitry SC2. Common support circuitry SC2' on an image sensor array may, if desired, perform some of the processing for the sensors in the array on a global basis.

Due to manufacturing variations, each lens may not be ideally positioned in lens array 14 and each sensor may not be ideally positioned in sensor array 16. To accommodate these variations, image sensor array 16 may be provided with control circuitry that allows selected portions of each image sensor to be switched into use. Each image sensor may be slightly oversized. During initial calibration operations, adjustments to the starting and ending rows and columns of each image pixel array can be identified. The control circuitry may then be used to shift the control signals that are applied to the image pixel array so that a desired subset of the image pixel rows are used and may be used to shift faulty rows of image pixels out of use (e.g., to implement a redundancy scheme for defect recovery). Similarly, control circuitry may be used to select which subset of the columns of each image pixel array are to be used. Sample-and-hold circuitry and analog-to-digital converter circuitry in support circuitry blocks SC2 may then be used to digitize the image data associated with the selected subset of columns.

Using this type of arrangement, a selected portion of each image sensor may be actively used and remaining portions of each image sensor may be unused. The control circuitry may be used to align the active portion of each image sensor with a corresponding lens in the lens array. If, for example, a lens in the lens array is shifted slightly to the left with respect to its nominal position, the control circuitry may be used to shift the active portion of the image sensor to the left by a corresponding amount. The control circuitry may therefore be used to ensure that the active portions of the image sensors are aligned with the lenses even in the presence of manufacturing variations.

The sensor array may also have control circuitry that allows selected image sensors to be powered down or otherwise inactivated. If, for example, a camera module has a 5×5 array of image sensors, it may be desirable to use all 25 of the image sensors to capture image data during normal image acquisition operations (e.g., normal still or video image acquisition operations). When the camera module is being used to render a preview image of a scene, however, the full resolution of the 5×5 array of image sensors is not needed. To conserve power, it may be desirable to activate only a subset of the 5×5 image sensor array. For example, it may be desirable to depower or otherwise inactivate all of the image sensors in the array except the central image sensor. As another example, if the image sensor array is being used in a 3-dimensional imaging application, it may be desirable to depower all of the image sensors except for a pair of image sensors in the array (e.g., a first image sensor at the far right of the array and a second image sensor at the far left of the array).

In arrangements in which some of the image sensors are not being used (e.g., when some of the image sensors are being depowered to conserve power in a preview mode of operation), control signals from support circuitry SC1 and/or support circuitry SC2 may be routed around unused image sensors using bypass circuitry.

On some image sensor arrays, such as image sensor arrays with widely spaced image sensors, it may be desirable to regenerate signals as they pass across the array. This may be accomplished using buffer circuitry.

Control signals can sometimes become skewed in an image sensor array. For example, row select signals RS that are generated by support circuitry SC1 may become skewed in sensor array configurations in which the row select signals are shared among multiple image sensors (e.g., by distributing the row select signals to rows of image sensor pixels in multiple pixel arrays in a row of array 16). To eliminate this skew, registers or other synchronizing circuits may be interposed between the support circuitry and image sensors.

Circuitry may be provided on an image sensor array that performs some or all of these functions (row and column signal line shifting, sensor bypassing, signal buffering, and signal synchronization). The circuitry, which is sometimes referred to herein as control circuitry, signal line shifting circuitry, sensor bypassing circuitry, signal buffering circuitry, and synchronizing circuitry, is shown as control circuit blocks CC1 and CC2 in the illustrative image sensor array shown in FIG. 13. Control circuit blocks CC1 and CC2 may use configurable circuitry, time-division multiplexing circuitry, and other circuitry for selectively routing signals on the image sensor array, for sharing signal lines between different signal sources, etc.

Figure 13:
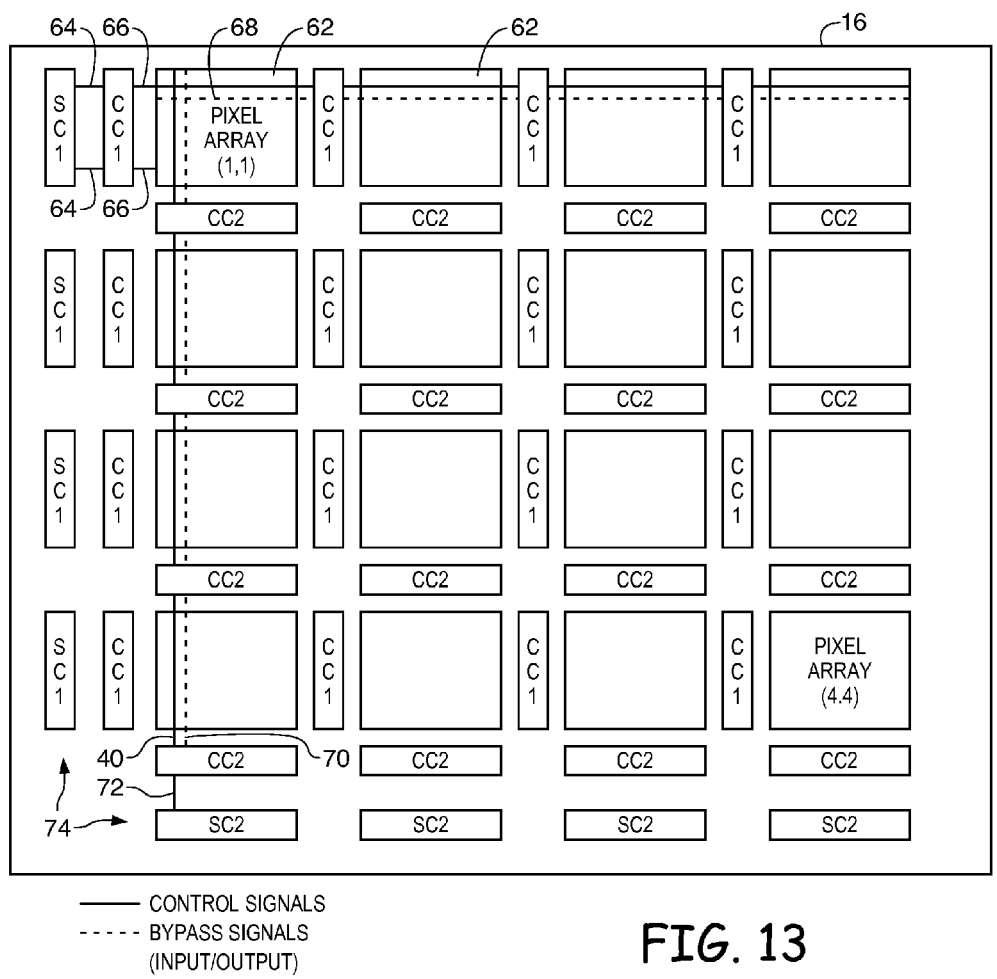
FIG. 13 is a diagram of an illustrative image sensor array in which control circuitry is being used to perform functions such as buffering, row and column signal line shifting, sensor pixel array bypassing, and signal synchronization in accordance with an embodiment of the present invention.

In image sensor array 16 of FIG. 13, there are four rows and four columns of image pixel arrays 62 (i.e., there are 16 sensors on the integrated circuit die that is used in forming image sensor array 16), each of which may, if desired, be independently controlled. Control signals from a support circuit block SC1 in each row of image sensors may be supplied to corresponding inputs associated with a control circuit blocks CC1 in that row of image sensors. Each control circuit block CC1 may, in turn, provide corresponding output signals to the rows of pixels in image sensor pixel arrays 62. If desired, some of the sensors (e.g., inactivated sensors) may be bypassed using circuits CC1, as indicated in FIG. 13 by bypass lines 68.

Control circuit blocks CC1 may be used to shift row control signals up or down in each sensor. For example, if some of the lower portion of an image sensor is not needed (e.g., due to lens misalignment), a CC1 block may shift the row select signals and other signals for the image sensor upwards to compensate. Each lens may be aligned differently, so, if desired, a subsequent CC1 block in a row may shift the row select signals and other control signals up or down, as needed. In this way, each image sensor in a given row of array 16 may have a vertically shifted active region that receives row control signals from the support circuitry SC1 in that row of the array.

Control blocks CC2 may operate similarly with respect to column lines such as line 40. When it is desired to shift the active portion of a given pixel array 62 right or left, control circuit block CC2 may be used to map lines such as lines 72 to a selected subset of output lines 40 (i.e., a subset of output lines 40 on the left-hand side of the array or a subset of output lines 40 on the right-hand side of the pixel array). When it is desired to vertically bypass a given image sensor pixel array 62, control circuit blocks CC2 above and below that pixel array 62 may be used to switch bypass lines such as bypass line 70 into use in place of the normal output lines 40 through the given pixel array 62.

A diagram of an illustrative block of control circuitry of the type that may be used in controlling the control signals that are distributed on horizontal control lines in a sensor array is shown in FIG. 14. As shown in FIG. 14, block CC1 may have multiple outputs each of which can be connected directly to an associated output or each of which can be shifted to an output associated with a different row in accordance with configuration control signals received on input 77. FIG. 15 is a diagram of an illustrative block of control circuitry of the type that may be used in controlling vertically distributed signal lines. As shown in FIG. 15, block CC2 may have a plurality of inputs and a plurality of associated outputs. The inputs of block CC2 may be coupled to respective output lines such as line 40 of FIG. 2 at the bottom of an associated pixel array 62. The outputs of a given block CC2 may be coupled to the lines 40 in the pixel array 62 that is located below that block CC2. Configuration control signals may be received on input 77. In response to the received configuration control signals, the output signals that are flowing down the set of output lines 40 in one pixel array may be routed to a shifted set of output lines 40 in the next pixel array. The circuits of FIGS. 14 and 15 may therefore be used for row shifting (FIG. 14) and column shifting (FIG. 15). Clock signals and other signals may be received on inputs 77 in addition to configuration control signals.

FIG. 16 is a diagram showing how image sensor control signals may be shifted and showing how an unused image sensor that has been powered down may be bypassed. In the example of FIG. 16, row control signals (e.g., row select signals, etc.) are being supplied on output lines 64 and are being received by the left-hand control block CC1. Power control circuitry 78 may supply individually controllable power supply voltages to respective image sensors 62 over lines 80. When it is desired to depower a given pixel array 62, power control circuitry 78 (e.g., an adjustable power supply circuit) may ground the power supply line 80 or may otherwise depower the power supply line 80 that is associated with that given pixel array 62. When a given pixel array is depowered, control circuit blocks CC1 to the left and right of that pixel array may route control signals past the depowered block using bypass lines 68, thereby bypassing the depowered block. If desired, power control circuitry 78 may be used to depower unused blocks of support circuitry SC1 and SC2 in addition to or instead of depowering unused image sensor pixel arrays.

In the example of FIG. 16, the first CC1 block has shifted the row control signals upwards, so that lower portion 78 of the left-hand pixel array 62 is unused and so that upper portion 76 of the left-hand pixel array 62 is used (i.e., portion 76 is active and portion 78 is inactive). This type of arrangement may be used, for example, in situations in which image misalignment due to lens misalignment has created a situation in which image light is being focused on portion 76 of array 62. After being shifted upwards in the left-hand pixel array 62, the control signals (row select, etc.) enter the right-hand CC1 block. In this example, the right-hand block CC1 routes the row control signals downwards (i.e., to lower rows near the middle of the pixel array). As a result, upper and lower portions 78 of the right-hand pixel array 62 are unused and the used portion 76 of the right-hand pixel array 62 lies in the middle of array 62. In a sensor array with numerous image sensor pixel arrays 62 in a row, this process may be repeated across the entire row, allowing row shifts to be made to switch different sets of rows into use in each pixel array as appropriate, while sharing a common set of row driver circuitry SC1 (e.g., a single block SC1 at the left-hand edge of each row of pixel arrays). As described in connection with FIG. 13, the type of shifting that is illustrated in FIG. 16 in connection with row adjustments may be applied to columns, using column circuit blocks CC2. Shifting circuits may also be used to bypass defective rows and columns of pixels, thereby ensuring that the circuitry on sensor array 16 functions properly, even in the presence of pixel defects.

Figure 17:
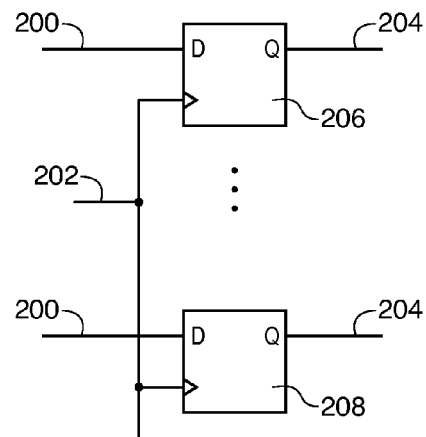
FIG. 17 is a diagram of illustrative synchronization circuitry that may be used in a control block in an image sensor array in accordance with an embodiment of the present invention.

FIG. 17 is a diagram of illustrative synchronization circuitry that may be used in the control blocks in an image sensor array (e.g., blocks CC1). As shown in FIG. 17, row control signals or other image pixel array control signals may be received on inputs 200 (e.g., from block SC1). The clock inputs of registers 206 may receive a common clock signal from timing control circuitry 63 and thereby can synchronize and deskew the signals on lines 202, producing deskewed and synchronized control signals on outputs 204.

Figure 18:
FIG. 18 is a diagram of illustrative buffer circuitry that may be used in control circuitry on an image sensor array in accordance with an embodiment of the present invention.

FIG. 18 is a diagram of illustrative buffer circuitry that may be used in an image sensor array (e.g., in control blocks CC1). As shown in FIG. 18, buffers 210 may be interposed in the control signal path between input 212 and output 214 (e.g., the input of a control block CC1 and the output of the same control block or another control block CC1). This helps maintain signal integrity for the control signals in image sensor array 16.

Figure 19:
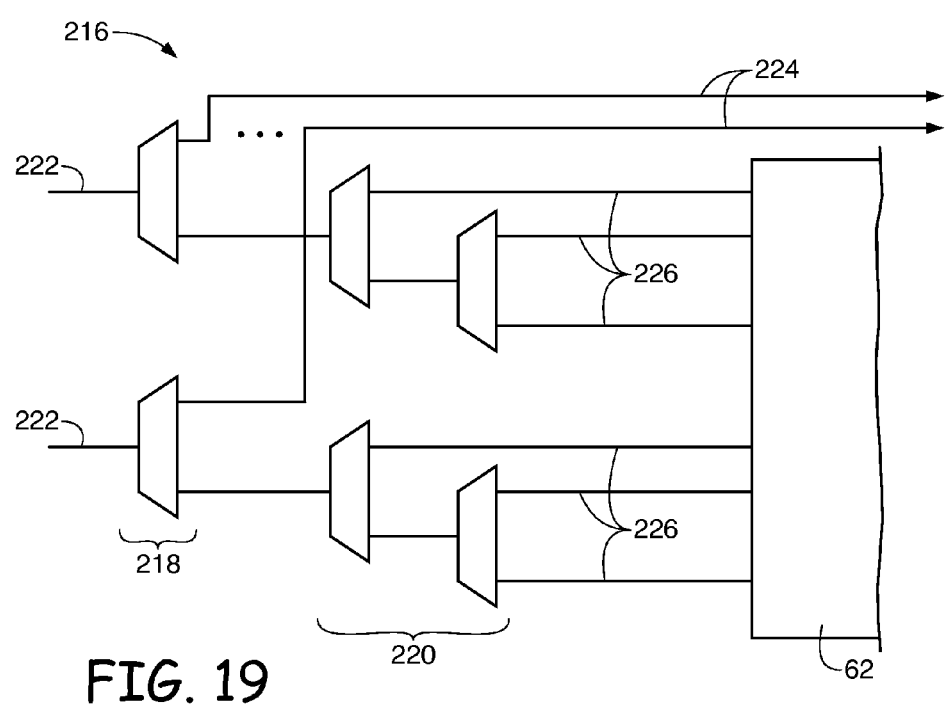
FIG. 19 is a diagram of bypassing and shifting circuitry that may be used in a block of control circuitry in an image sensor array in accordance with an embodiment of the present invention.

FIG. 19 is a diagram of bypassing and shifting circuitry that may be used in a control block (e.g., blocks CC1 and/or CC2) in an image sensor array. As shown in FIG. 19, circuitry 216 may include bypass circuitry 218 and shifting circuitry 220. Control signals (e.g., control signals from support circuitry SC1 or data signals from a pixel array that are flowing towards support circuitry SC2) may be received at inputs 222. Corresponding outputs may be provided to array 62 (or other suitable circuitry in the image sensor array). When it is desired to bypass array 62, the multiplexers in bypass circuitry 218 may be configured to route signals from inputs 222 to corresponding bypass lines 224. The bypass circuitry on the far side of array 62 may likewise be configured to receive the bypass signals.

When it is desired to implement a shift function for a set of row control signals or column-based data, bypass circuitry 218 may be configured to route signals from inputs 222 towards array 62. Circuitry 220 may then be configured to provide a desired amount of shifting. In the example of FIG. 19, shifting circuitry 220 includes two layers of multiplexers, so shifting may be adjusted within the range of no shifts (the upper lines at the output of circuitry 220), to two line shifts (the lower most lines at the output of circuitry 220). An intermediate setting is also possible in which the input signals are shifted by one row or column (see, e.g., the middle lines at the outputs of circuitry 220).

Figure 20:
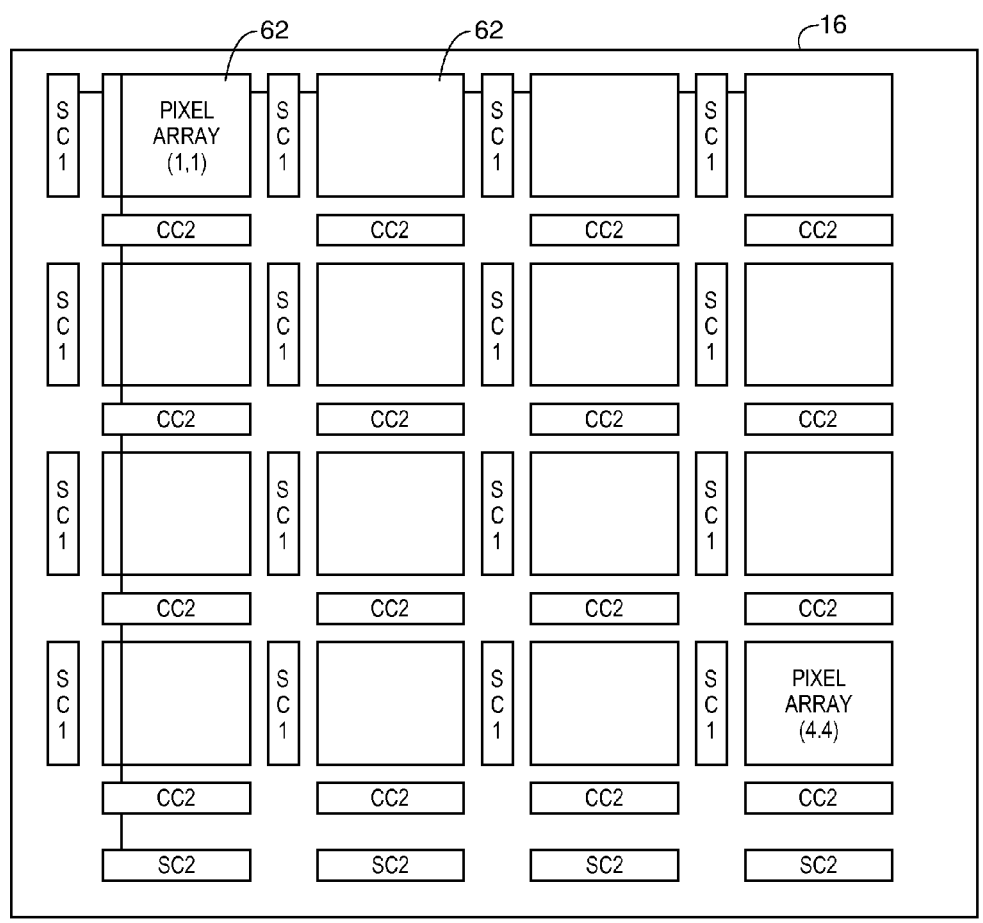
FIG. 20 is a diagram of an illustrative image sensor having control circuit blocks used only or primarily for column-based control functions and having distributed row-based control circuitry in accordance with an embodiment of the present invention.

A diagram of an illustrative image sensor having control circuit blocks used only for column-based control functions and having distributed row-based control circuitry is shown in FIG. 20. A shown in FIG. 20, array 16 may be provided with local copies of support circuitry SC1 (e.g., row drivers and other circuits for producing row control signals such as row select signals), obviating the need for row-based control circuit blocks CC1. This type of arrangement may be used, for example, when implementing image sensor arrays using a front-side illumination arrangement in which space for interconnect lines is constrained. In general, the image sensor arrays may be formed using backside illumination architectures or front-side illumination architectures. In the FIG. 20 example, control blocks CC1 have been omitted from the image sensor array to save routing space. This is merely illustrative. Any suitable components of image sensor array 16 may be omitted to reduce the requirements for routing resources on the image sensor array if desired (e.g., blocks CC2 may be omitted, parts of blocks CC1 and/or CC2 may be omitted, etc.).

Figure 21:
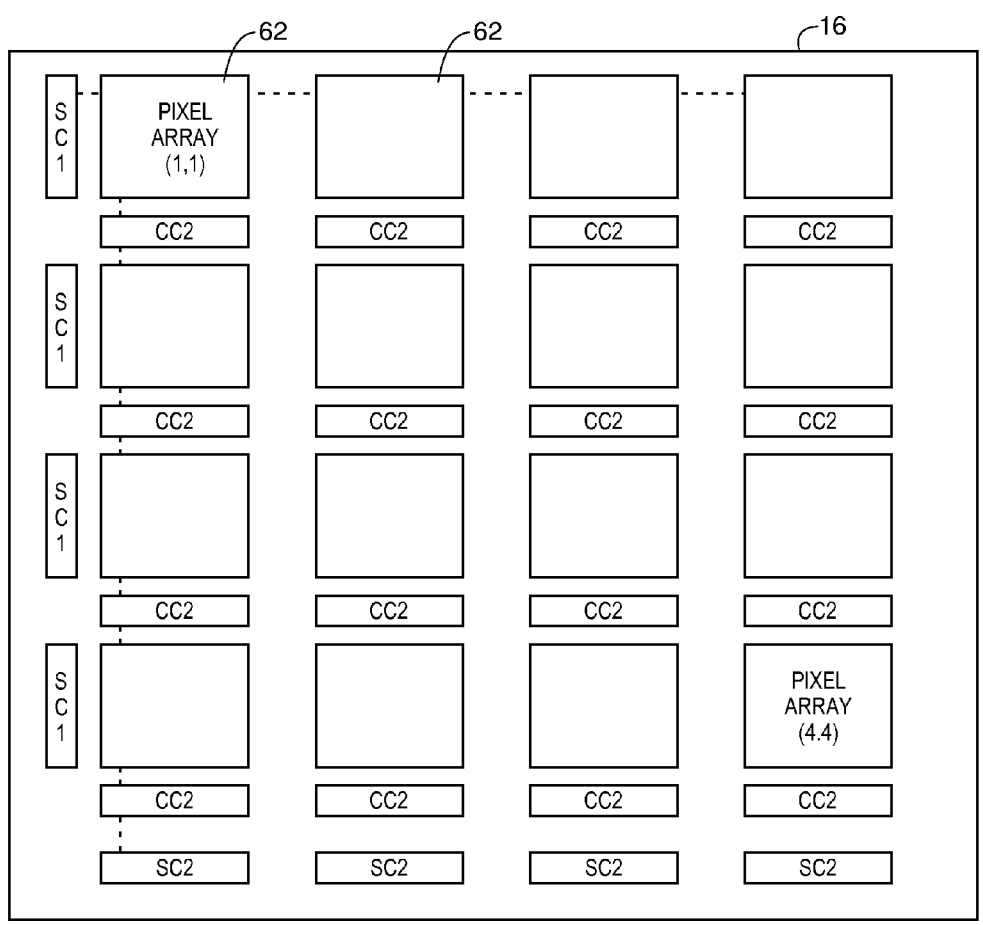
FIG. 21 is a diagram of an illustrative image sensor array integrated circuit having column-based control blocks and a shared row control circuit in each row of image sensor pixel arrays on the image sensor array integrated circuit in accordance with an embodiment of the present invention.

FIG. 21 is a diagram of an illustrative image sensor array having column-based control blocks and a shared row control circuitry. In the FIG. 21 example, there is insufficient room for the local versions of support circuitry SC1, so the SC1 blocks have also been omitted. Column-wise signal line shifting may still be performed using control blocks CC2.

Figure 22:
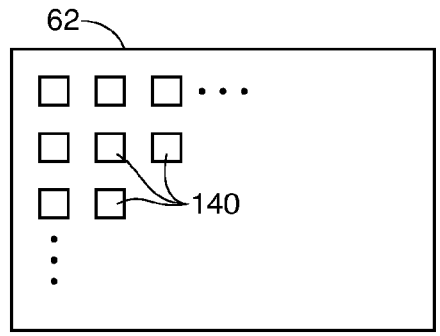
FIG. 22 is a diagram of an illustrative image sensor having rows and columns of rectangular image sensor pixels in accordance with an embodiment of the present invention.
Figure 23:
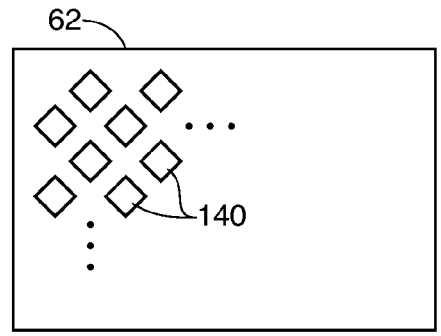
FIG. 23 is a diagram of an illustrative image sensor having diagonally oriented image sensor pixels in accordance with an embodiment of the present invention.

FIG. 22 is a diagram of an illustrative image sensor pixel array 62 having rows and columns of rectangular image sensor pixels 140. If desired, non-rectangular image sensor pixels 140 may be used, as shown in the diamond-pixel example of FIG. 23.

Figure 24:
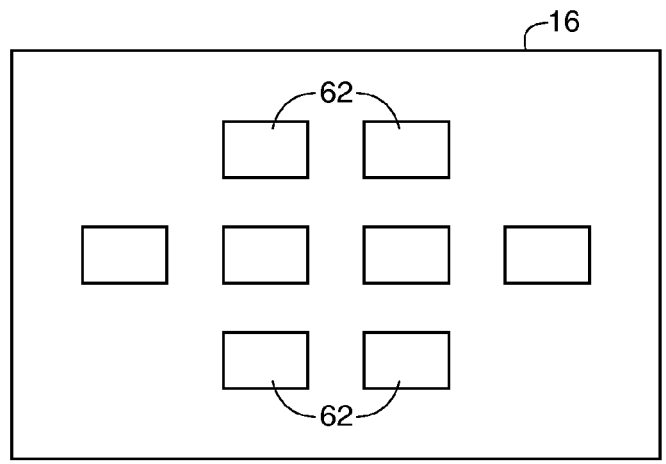
FIG. 24 is a diagram of an image sensor array having a non-rectangular array of image sensors in accordance with an embodiment of the present invention.

If desired, array 16 may have a non-rectangular array of image sensors 62, as shown in FIG. 24.

Figure 25:
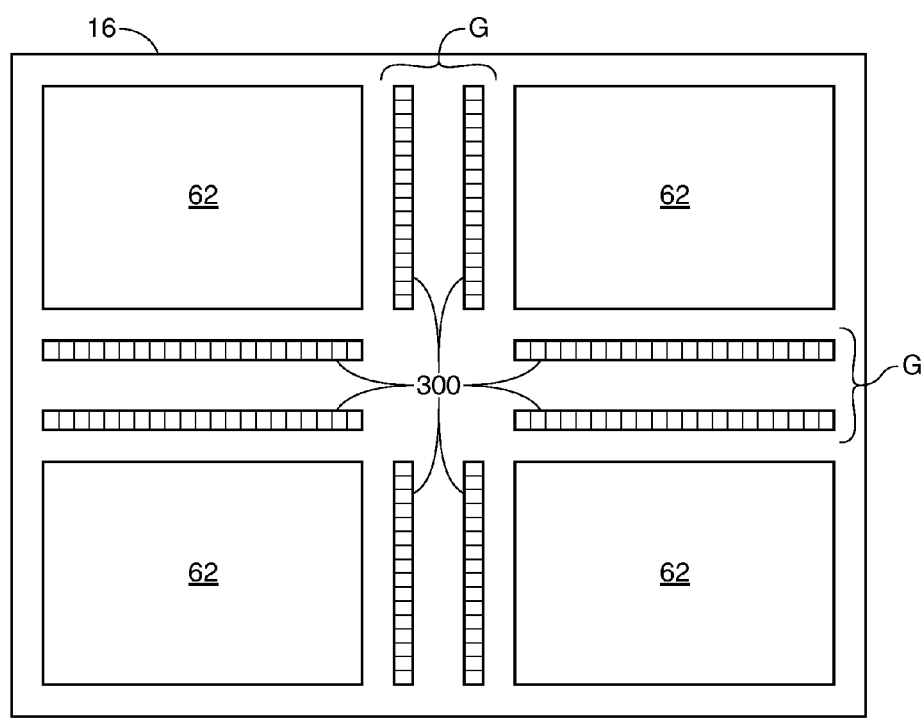
FIG. 25 is a diagram of an image sensor array showing how rows and columns of reference pixels may be located in the spaces between adjacent image sensors in accordance with an embodiment of the present invention.

As shown in FIG. 25, an image sensor array integrated circuit may have gaps such as gaps G between adjacent image sensor pixel arrays 62 (and associated control circuits). Gaps G may be, for example, 200-300 microns wide or may have other suitable sizes. Because the area within gaps G is not generally illuminated by light from lenses, circuitry may be incorporated within gaps G such as unilluminated reference pixels 300. Pixels 300 may be used by digital image and video processing circuitry or other circuitry on integrated circuit 16 or in separate processing circuitry 18 to subtract dark current noise from gathered image data (e.g., to implement a noise compensation scheme in device 10).

Various embodiments have been described illustrating electronic devices such as portable electronic devices with camera modules. A camera module may have an image sensor array that includes multiple image sensors and may have a corresponding lens array. Support circuitry such as row driver circuitry for generating row-based control signals such as row select signals and support circuitry such as column-based readout circuitry that receives image data signals from columns of data lines may be arranged around each image sensor on the array or blocks of support circuitry may be shared by multiple sensors. To accommodate manufacturing variations, image sensors may be oversized. Control circuitry such as bypass and shifting circuitry may be used to bypass deactivated image sensors and to shift signals to different signal lines within each sensor.

The foregoing is merely illustrative of the principles of this invention which can be practiced in other embodiments.

What is claimed is:

1. An image sensor array integrated circuit, comprising:
   a plurality of image sensor pixel arrays each having rows and columns of image sensor pixels; and
   row driver circuitry that generates row select signals for the image sensor pixels;
   row lines that distribute the row select signals from the row driver circuitry to the image sensor pixels in a plurality of the image sensor pixel arrays; and
   configurable control circuitry that shifts the row select signals between different row lines, wherein the image sensor pixel arrays are associated with an array of lenses characterized by a center-to-center lens spacing and wherein at least some of the pixel arrays are characterized by a center-to-center pixel array spacing that is greater than the center-to-center lens spacing.

2. The image sensor array integrated circuit defined in claim 1 wherein the image sensor array has a center region that is surrounded by a peripheral region and wherein the image sensor pixel arrays in the peripheral region have larger center-to-center spacings than the image sensor pixel arrays in the center region.

3. The image sensor array integrated circuit defined in claim 1 wherein the configurable control circuitry comprises bypass circuitry that is configured to selectively bypass a given image sensor pixel array in the image sensor array integrated circuit, wherein the plurality of image sensor pixel arrays includes a two-dimensional array of the image sensor pixel arrays, wherein the configurable control circuitry comprises synchronization circuitry for deskewing the row select signals, wherein the configurable control circuitry comprises buffer circuitry, wherein the image sensor pixel arrays comprise columns of data lines that convey digital image data signals to readout circuitry and wherein the configurable control circuitry comprises control circuit blocks that shift the digital image data signals to selected sets of the data lines so that some of the data lines are unused.

4. The image sensor array integrated circuit defined in claim 3 wherein the image sensor array has a center region that is surrounded by a peripheral region and wherein the image sensor pixel arrays in the peripheral region have larger center-to-center spacings than the image sensor pixel arrays in the center region.

5. An image sensor pixel array integrated circuit, comprising:
   a plurality of image sensor pixel arrays arranged in rows and columns, each image sensor pixel array having an associated set of data output lines; and
   a plurality of control blocks that are configured to shift signals on the data output lines so that an image sensor pixel array in one row supplies output data on a different subset of the data output lines than the image sensor pixel array in another row.

6. The image sensor pixel array integrated circuit defined in claim 5 wherein the image sensor pixel arrays are separated from each other by gaps, the image sensor pixel array further comprising unilluminated reference pixels formed within the gaps.

7. The image sensor pixel array integrated circuit defined in claim 6 further comprising row driver circuits that are shared among multiple image sensor pixel arrays in a given one of the rows.

* * * * *